United States Patent [19]

Codama et al.

[11] Patent Number: 5,731,600
[45] Date of Patent: Mar. 24, 1998

[54] IMAGE SENSOR DEVICE ON INSULATING SURFACE

[75] Inventors: Mitsufumi Codama, Ibaragi; Michio Arai, Tokyo, both of Japan

[73] Assignee: Semiconductor Energy Laboratory Co., Ltd., Kanagawa-ken, Japan

[21] Appl. No.: 404,816

[22] Filed: Mar. 14, 1995

[30] Foreign Application Priority Data

Mar. 15, 1994 [JP] Japan .................... 6-071458

[51] Int. Cl.$^6$ .................... H01L 31/062; H01L 31/113
[52] U.S. Cl. .................... 257/59; 257/72; 257/290; 257/291; 257/292; 257/443; 257/446; 349/43; 349/46; 349/47
[58] Field of Search ............... 257/59, 72, 290, 257/291, 292; 349/43, 46, 47

[56] References Cited

U.S. PATENT DOCUMENTS

| 5,196,911 | 3/1993 | Wu ........................ 257/59 X |
| 5,495,119 | 2/1996 | Ikeuchi .................. 257/365 |
| 5,591,990 | 1/1997 | Misawa et al. ........... 257/59 X |

FOREIGN PATENT DOCUMENTS

| 60-58676 | 4/1985 | Japan . |
| 61-241970 | 10/1986 | Japan .................. 257/59 |

OTHER PUBLICATIONS

Transactions On Electron Devices, vol. ED-32, No. 8, Aug. 1985, pp. 1559-1562."High-Gain Photodectors in Thin Film Transistors Fabricated from Laser-Crystallized Silicon on Fused Silica", A. Chiang et al.

ITE Technical Report, vol. 18, No. 4, pp. 19-24, IPU'94, Yamada et al., Jan. 1994, pp. 19-24.

*Primary Examiner*—William Mintel
*Attorney, Agent, or Firm*—Sixbey, Friedman, Leedom & Ferguson, PC; Gerald J. Ferguson, Jr.; Eric J. Robinson

[57] ABSTRACT

An image sensor device comprising a gate electrode provided on an insulating surface, a gate insulating film provided on the gate electrode, an active region, provided on the gate insulating film, for generating a carrier upon light irradiation, and doped regions provided with the active region between the doped regions. The optical carrier generated in the active region by light irradiation to the active region flows between the doped regions as current. The light irradiation can be deleted from this current with a high sensitivity.

6 Claims, 6 Drawing Sheets

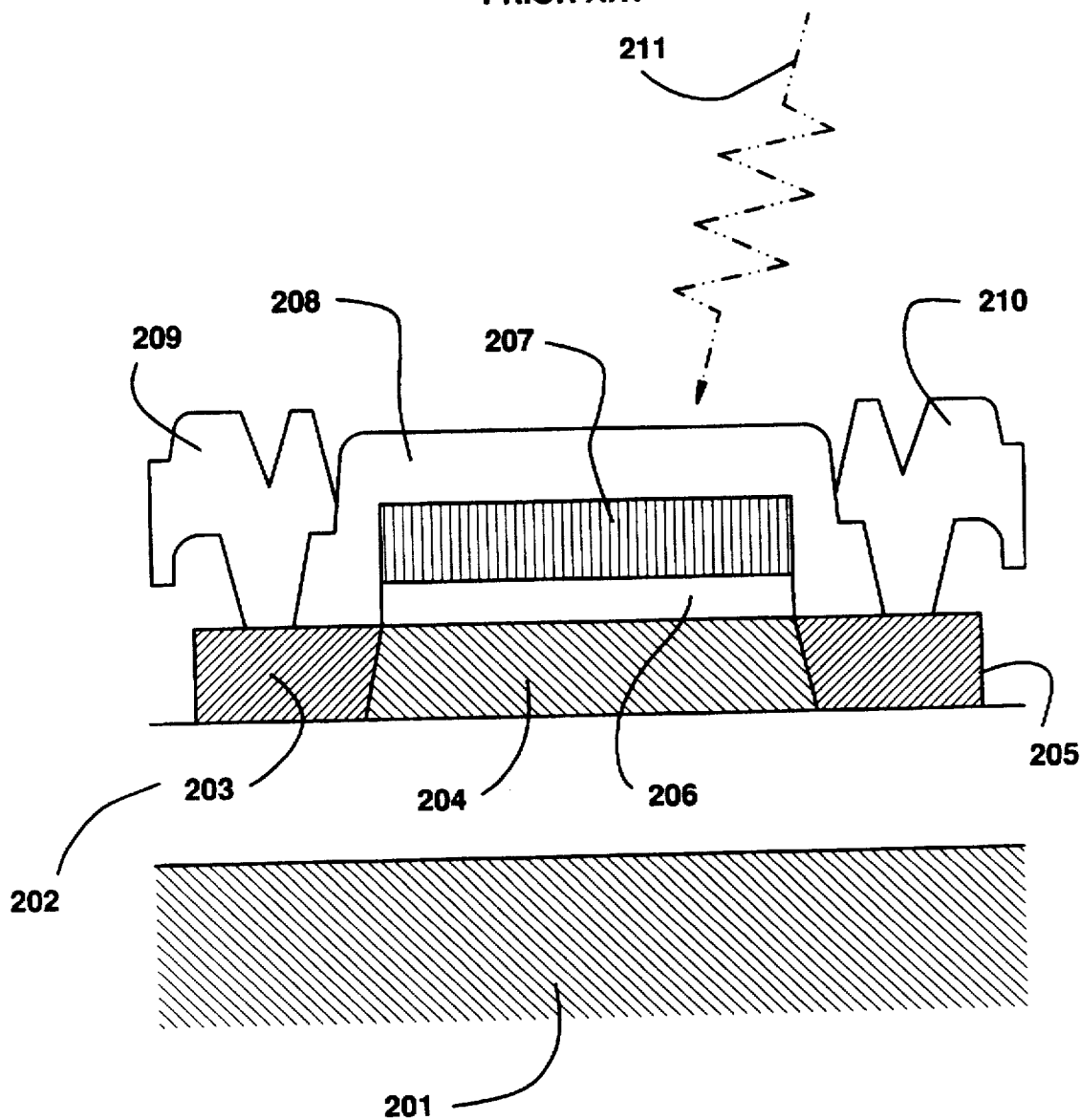

IMAGE SENSOR DEVICE ON INSULATING SURFACE

BACKGROUND OF THE INVENTION

1. Field of the Invention

The present invention relates to an image sensor device having a photoelectric converting function and a method for producing the same. In particular, it relates to a photo transistor having a function for amplifying a photoelectric signal of a crystalline silicon used as a photosensitive material.

2. Description of the Related Art

Recently, there are strong demands for miniaturizing a facsimile machine and decreasing its weight and cost in conformity with its wide application. As a result, of course, there are demands for miniaturizing an image sensor used in the facsimile machine and reducing a cost thereof.

Image sensors used in facsimile machines or the like are generally classified into three types, i.e., a non-contact type, a contact type and a complete contact type. The non-contact type machine using a CCD is disadvantageous in comparison with the other two types, since the original is projected through a reduction lens system in the non-contact type machine. However, this machine is advantageous in price because the non-contact type machine may be produced through an LSI process which has been already established and also, the small size CCD chip may be used. The contact type and complete contact type machines are advantageous in miniaturization and reduction in weight in comparison with the non-contact type machines, but suffers from a problem that the manufacturing process, loading, and assembling are difficult and increase the manufacturing cost. In particular, the fact a selfoc lens array or a thin planar glass which is an expensive optical component is used is one of the factors that obstruct the low cost production of the image sensors for these two types.

The contact type image sensors for facsimile machines are generally classified into a multi-chip type having a number of MOSLSI's thereon and a thin film type in which an amorphous silicon thin film or the like is used in a photosensor and formed on an insulating substrate. Either one of these types uses the selfoc lens array. Since the multi-chip type ones are manufactured through an MOSLSI manufacture step which has been already well established, the yield thereof is high, and it is said that the stable supply may be insured. However, the multi-chip type has a disadvantage that non-uniformity in characteristics among the MOSLSI chips mounted is likely to occur due to errors in an assembling step or the like. On the other hand, the thin film type needs a large number of manufacturing steps so that it tends to have a low yield thus increasing the manufacturing cost. However, since the thin film type may be produced on the insulating substrate such as a glass or ceramic plate through the thin film step, the thin film type is advantageous in that it is easy to obtain an original reading chip having the same length as a width of the original by using a large size insulating substrate.

It is well known to use a photo-conductor type and a photo-diode type as a photoelectric converting element of an image sensor. In a method of the photo-conductor type, a material such as an amorphous silicon or the like in which a resistance is decreased by the application of rays of light thereto is used, and the reduction of the resistance is read out as a change in, for example, a current.

In general, in the photo-conductor type, since it is possible to cause a large amount of a current to flow, the photoconductor type is stable against noise. However, the photoconductor type is inferior in responsivity and is disadvantageous to the demands of increasing the speed of operation of the facsimile machine.

On the other hand, in the photo-diode type, carriers generated in a depletion layer of a diode when rays of light are projected to the diode are attracted by a voltage which is applied to the diode in a reverse bias direction, thereby causing the current to flow. The current is used as a signal which is responsivity to the intensity of the rays of light. The responsivity of the photo-diode type is very high but the current which flows through the diode is small so that the photo-diode type is liable to receive the affect of noise. Therefore, a large load would be imposed to electrically cope with the reduction of the noise. Also, in the photo-diode type, since the manufacturing step for producing a drive circuit for readout is different from the step for producing the photo-diode, a very large number of complicated steps are required. In general, the yield tends to be low. Also, in the case where the reading driver circuit is an externally mounted type IC, a number of reading chips are required, which makes it difficult to reduce the cost.

The above-noted tasks to be solved are summarized as follows:

The number of the manufacture steps should be reduced. Accordingly, the devices should be produced with a high yield and a low cost.

The reading driver circuit should be constructed on the same substrate as that of the photoelectric converting element to thereby obviate the needs to mount a large number of external chips. Accordingly, it is possible to enlarge an effective surface area and to produce the device for a low cost.

As a result, a large scale reduction optical system may be dispensed with.

The light responsivity is good and high speed operation is possible.

It is possible to obtain a large signal to thereby obviate the adverse effect of noise.

A thin film photo-transistor is proposed by the present inventors for solving all the above-noted tasks. The structure of this element is based upon a TFT (Thin Film Transistor) which utilizes a crystalline silicon semiconductor thin film formed on a substrate having an insulating surface.

An example of the thin film photo-transistor is shown in FIG. 2. In FIG. 2, reference numeral 201 denotes a substrate made of glass or quartz, and numeral 202 denotes an insulating layer made of silicon oxide. Numeral 203 and 205 denote regions which are doped with impurities for forming one conductive type. These regions correspond to source/drain regions of a general thin film transistor. Also, numeral 204 denotes an active region for generating carriers by the application of light. This active region corresponds to a channel-forming region of the general TFT. The regions 203 to 205 are referred to as active layers. Numeral 206 denotes a gate insulating film, and numeral 207 denotes a gate electrode. Also, numeral 208 denotes an interlayer insulating layer and numerals 209 and 210 denote wiring electrodes.

If the structure shown in FIG. 2 is used, the incidental side of light is on the substrate 201 side or the gate 207 side.

However, in the case where rays of light are introduced from the substrate 201, a distance between the sensor and the light introduction surface is increased to some extent corresponding to a necessary thickness (about 0.7 to 1 mm) of the substrate. As a result, it would be impossible to realize a linear image sensor which is called a complete contact type. Also, in this case, a light permeation material has to be used for the substrate. In consideration of the manufacture step of the crystalline silicon film, only quartz substrate could be used as the transparent plate that could stand the high temperature treatment exceeding 900° C. This would cause serious problems in cost and practical use.

On the other hand, the light 211 is introduced from the gate 207 side, an attenuation of rays of light that have passed through the gate electrode 207 would cause a problem. In general, silicon which is formed to have a low resistance by doping with a large amount of impurities is used. However, it is difficult to cause the light to pass through the thus produced gate electrode. Only the light having an intensity of one third to one tenth of the incidental light would reach the active layers of the photosensitive region (of course, depending upon the film thickness and the amount of the doped impurities). Namely, this structure suffers from a problem that a generated signal is small due to the reduction of the quantity of incidental light.

SUMMARY OF THE INVENTION

Another object of the invention is to provide a structure and method for effectively introducing light to a photoelectric converting element on the basis of a quite novel principle using a crystalline silicon thin film transistor. Also, it is possible to provide a manufacture method by which the photoelectric converting element and a reading driver circuit may be produced through the same manufacture process or a somewhat different manufacture method.

According to the present invention, there is provided an image sensor device having an active layer for producing optical carriers upon light-projection between a source region and a drain region of an MIS transistor using a silicon having crystalline characteristics on a substrate and an image sensor element for photoelectrically converting, into a signal, a change of a source/drain current generated resulting from a temporary accumulation, within the active layer, of optical carriers having an opposite polarity to that of ones of the optical carriers that flow through a boundary portion in the vicinity of a gate insulating layer, the image sensor device comprising the improvement wherein a gate electrode and a gate insulating film that form the image sensor device are located closer to the substrate than the active layer is.

In the above-described structure, a circuit for driving the image sensor element is constituted by an MIS type thin film transistor which has been produced by using the active layer formed for the image sensor element.

The image sensor element is basically a photoelectric converting element and has a function for converting rays of light, to be inputted thereinto, into an electric signal.

Referring to FIG. 1, the device according to the invention, for example, includes a substrate 101, an insulating layer 102, a gate electrode 103, a gate insulating film 104, an active region 106 (corresponding to a channel region) made of crystalline silicon for generating optical carriers, layers 105 and 107 (corresponding to source/drain regions) doped with impurities for reducing the resistances, an interlayer insulating layer 108, and wiring electrodes 109 and 110.

In the case where the source/drain regions 105 and 107 are of an N-type, a positive voltage is applied to the gate electrode 103, and in the case where the source/drain regions 105 and 107 are of a P-type, a negative voltage is applied to the gate electrode 103.

In accordance with one aspect of the invention, it is possible to project light 111 from the upper side of the substrate. Accordingly, it is unnecessary to use a transparent one as the substrate 101. Namely, it is possible to use a less expensive substrate such as an alumina substrate or a semiconductor substrate.

The gate electrode is provided closer to the substrate than the active layer so that it is possible to project the light from above the active layer and it is possible to effectively utilize rays of incidental light.

BRIEF DESCRIPTION OF THE DRAWINGS

In the accompanying drawings:

FIG. 2 is a schematic view showing a conventional image sensor element;

DESCRIPTION OF THE PREFERRED EMBODIMENTS

One embodiment of the invention will now be described with reference to FIGS. 3A to 3G, FIGS. 4A to 4E and FIGS. 5A and 5B.

Figure 1:
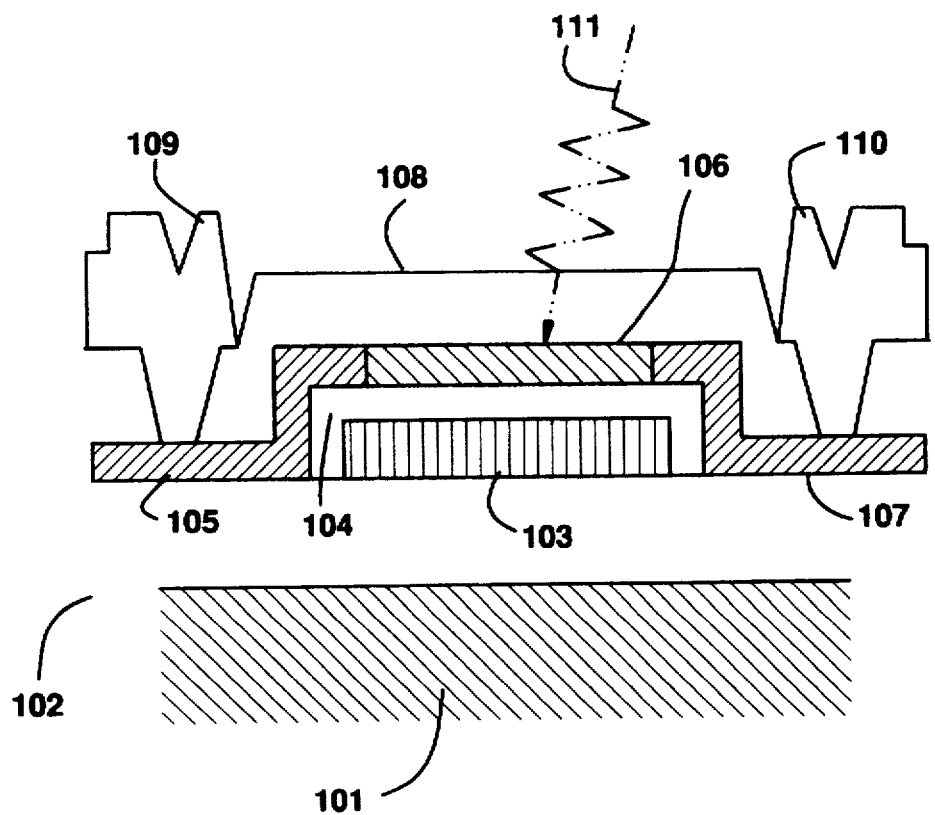
FIG. 1 is a schematic view showing an example of an image sensor element according to the present invention.
Figure 3A:
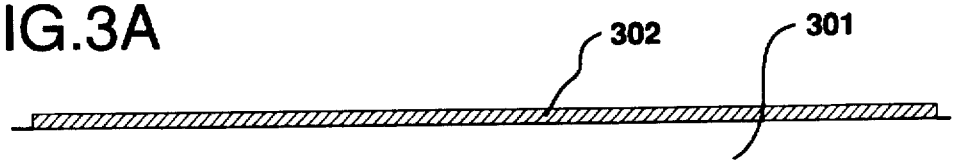
FIGS. 3A to 3G are views showing manufacture steps for producing an image sensor element and a thin film transistor which forms a peripheral circuit.
Figure 3B:
Figure 3C:
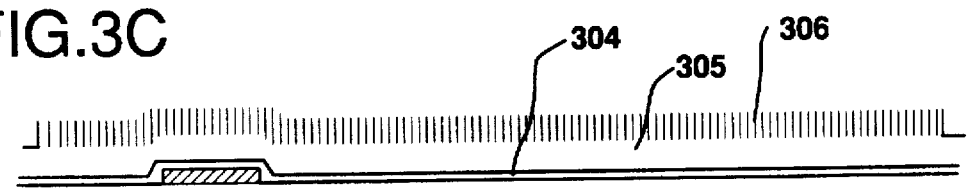

In the embodiment, an alumina substrate 301 is used as a substrate having an insulating surface. A thick n+ poly-Si film 302 having a thickness of 300 nm is deposited through an LPCVD method as shown in FIG. 3A. Next, the n' poly-Si film 302 is subjected to a patterning process for a gate electrode. Thus, the gate electrode 303 is obtained (see FIG. 3B).

Subsequently, a silicon nitride film 304 is deposited at a thickness of 20 nm as a protective film, and a silicon oxide film 305 is deposited at a thickness of 200 nm as a gate insulating film. Furthermore, an amorphous silicon film 306 is deposited at a thickness 250 nm to form an active layer. Any one of these films are deposited through the LPCVD method (see FIG. 3C).

Subsequently, an amorphous silicon film 306 is crystallized through a solid phase development by heating at 600° C. for 20 hours. Thus, the crystalline silicon film is obtained.

Figure 3D:
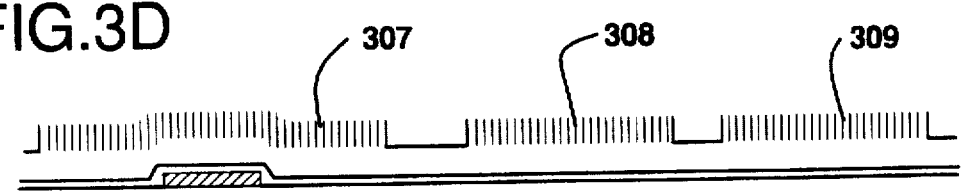

Next, as shown in FIG. 3D, the crystalline silicon film that has been obtained through the above-described heating treatment is patterned into island shapes. Thus, the island-shaped crystalline silicon films designated by numerals 307 to 309 are obtained. The portion 307 is to be an active layer for constituting an image sensor element, and the portions 308 and 309 are to be active layers of a thin film transistor of a peripheral drive circuit for driving the image sensor element.

Figure 3E:
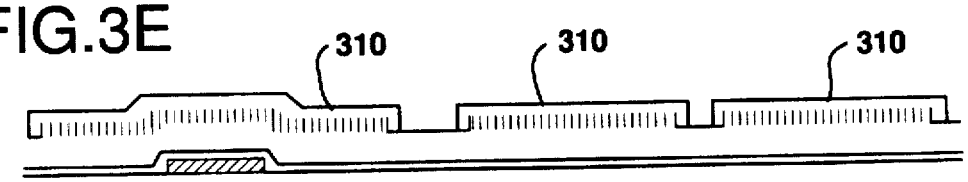

Subsequently, as shown in FIG. 3E, a thermal oxidation is carried out to form a silicon oxide film 310. This step is carried out in an oxidation atmosphere at a temperature of 1,000° C. A thickness of the silicon oxide film is 100 nm. Although, in this embodiment, the thermal oxidation treatment is used to form the silicon oxide, it is possible to directly deposit the silicon oxide film by the LPCVD method or the like.

Figure 3F:
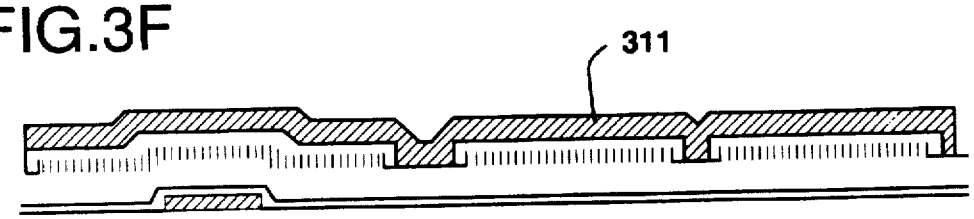

Immediately after the formation of the silicon oxide film, through the LPCVD method, an n+ poly-Si film 311 doped with phosphorus exceeding about $1\times10^{20}$ atoms/cm$^3$ is deposited at a thickness of about 300 nm as a gate electrode to be used in the driver portion (see FIG. 3F).

Figure 3G:
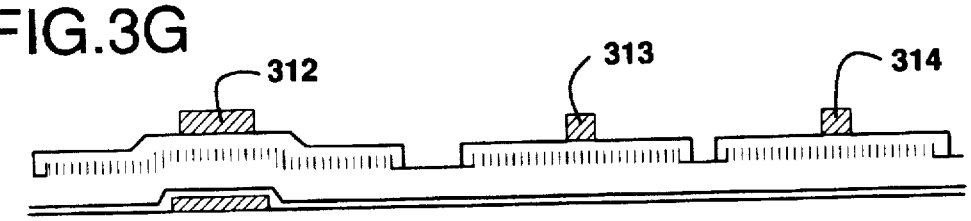

The n+ poly-Si film is patterned through a dry etching method to form gate electrodes 313 and 314 (see FIG. 3G.)

In this case, it is possible to subsequently etch a part or all of the oxide silicon films on the active layers 307 to 309 forming a contact layer. Also, in this embodiment, a left portion indicated by numeral 312 is left also on the photoelectric converting element (i.e., an element on the most left side in FIG. 3G), and this portion is utilized as a mask which is to be used in doping. The embodiment is just related to an example in which the portion indicated by reference numeral 312 is used as the doping mask since the opaque substrate is used. However, for instance, in the case where a transparent substrate such as a quartz substrate or the like is used, the left portion 312 is removed without leaving it on the photoelectric converting element, and the exposure is effected from the back surface of the substrate after the application of resist, so that the n+ poly-Si becomes a mask, and the resist is left at portions which should not be doped upon the self-alignment. Thus, it is possible to carry out the doping step using the resist as the doping mask.

In an ion injection or an ion doping method for an N-type, phosphorus of $1\times3$ $10^{15}$ atoms/cm$^2$ is injected at an acceleration voltage of 70 kV. The regions 400/402 which are the source/drain regions of the image sensor element and the active region 401 of the image sensor element for generating the carriers by the light projection are thus formed. Simultaneously, the source/drain region 403/405 and the channel-forming region 404 of the thin film transistor of the peripheral driver circuit are formed (see FIG. 4A).

Figure 4A:
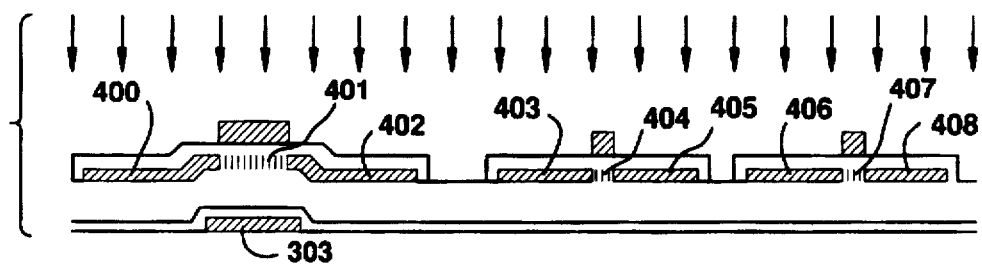
FIGS. 4A to 4E are views showing manufacture steps for producing the image sensor element and the thin film transistor which forms a peripheral circuit.
Figure 4B:
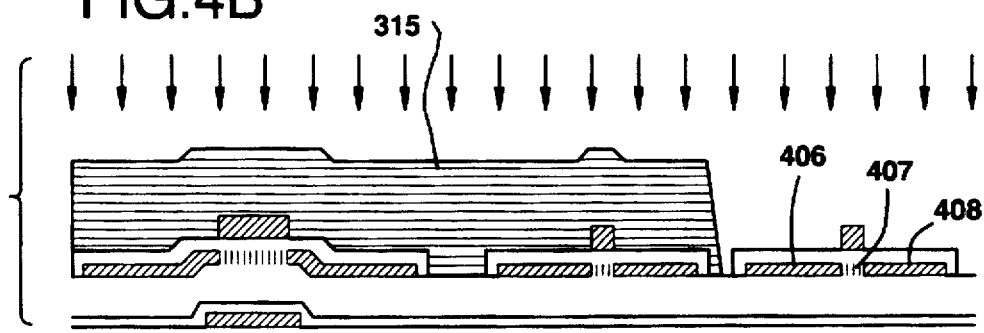
Figure 4C:
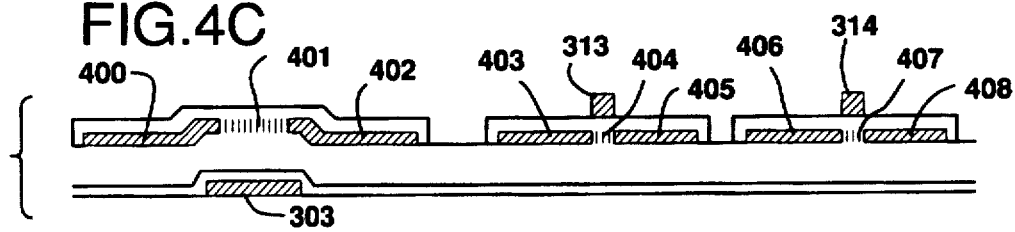

Also, for a P-type, the portion which should not be subjected to the introduction of impurities is covered by a photo resist 315 and boron of $5\times10^{15}$ atoms/cm$^2$ is injected at an acceleration voltage 40 kV. Thus, the source/drain region 406/408 and the channel-forming region 407 of the thin film transistor of the peripheral driver circuit are formed (FIG. 4B).

Incidentally, the right side and the left side of the thin film transistor of the peripheral driver circuit are of a P-channel type and a N-channel type, respectively.

Then, after the resist 315 has been removed, the left portion 312 which has been used as a mask on the image sensor element is removed by etching. Then, in the condition shown in FIG. 4C, the heat treatment is carried out. This heat treatment is effected for activating the introduced impurities. This heat treatment is carried out at an anneal temperature of 600° C. for twelve hours in a nitrogen atmosphere.

Figure 4D:
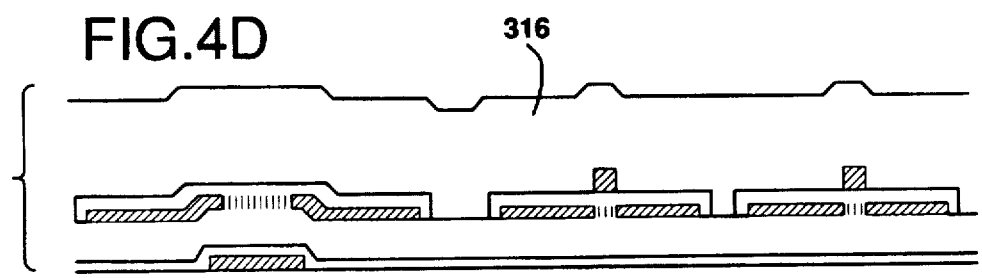

Subsequently, a silicon oxide film 316 or further a PSG (Phosphosilicate Glass) film is deposited at about 800 nm in total as an interlayer insulating film by a normal pressure CVD method (see FIG. 4D).

Figure 4E:
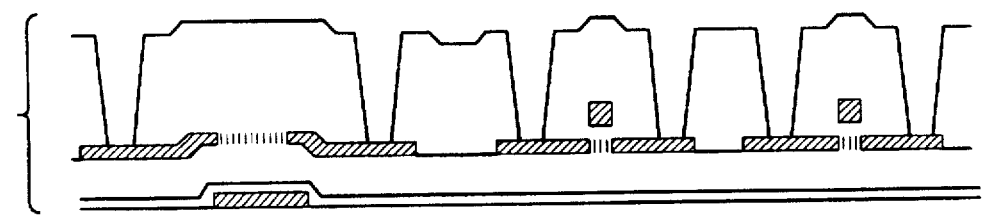
Figure 5A:
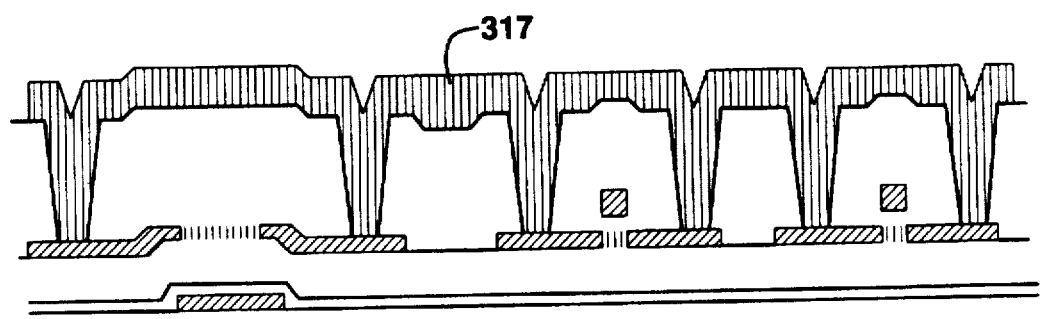
FIGS. 5A and 5B are views showing manufacture steps for producing the image sensor element and the thin film transistor which forms a peripheral circuit.
Figure 5B:
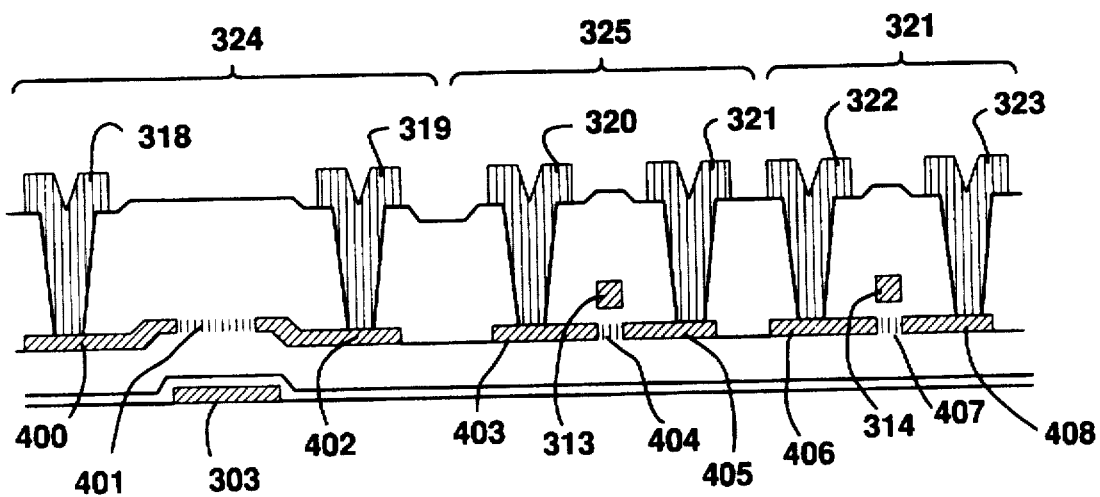

Subsequently, as shown in FIG. 4E, contact holes are formed, and an aluminum film 317 is formed by sputtering (see FIG. 5A).

After the aluminum film 317 has been patterned into respective wiring electrodes 318 to 323, finally, an anneal treatment is carried out for one hour in a hydrogen atmosphere kept at 350° C. In order to enhance the electric characteristics. Thus, the desired image sensor device 324 and the thin film transistors 325 and 326 for forming the reading driver circuit may be simultaneously formed.

In the embodiment, the image sensor element 324 is of a bottom gate type in which the gate electrode 303 is located below the active region 401. Also, the thin film transistors 325 and 326 for forming the peripheral driver circuit are of a top gate type in which the gate electrodes 313 and 314 are located above the active layers 404 and 407. However, if the electric characteristics of the driver circuit portion has a desired specification, it is possible to omit some of the manufacture steps by forming all the thin film transistors into a bottom gate type. In other words, it is possible to produce the image sensor devices at lower cost.

Figure 6:
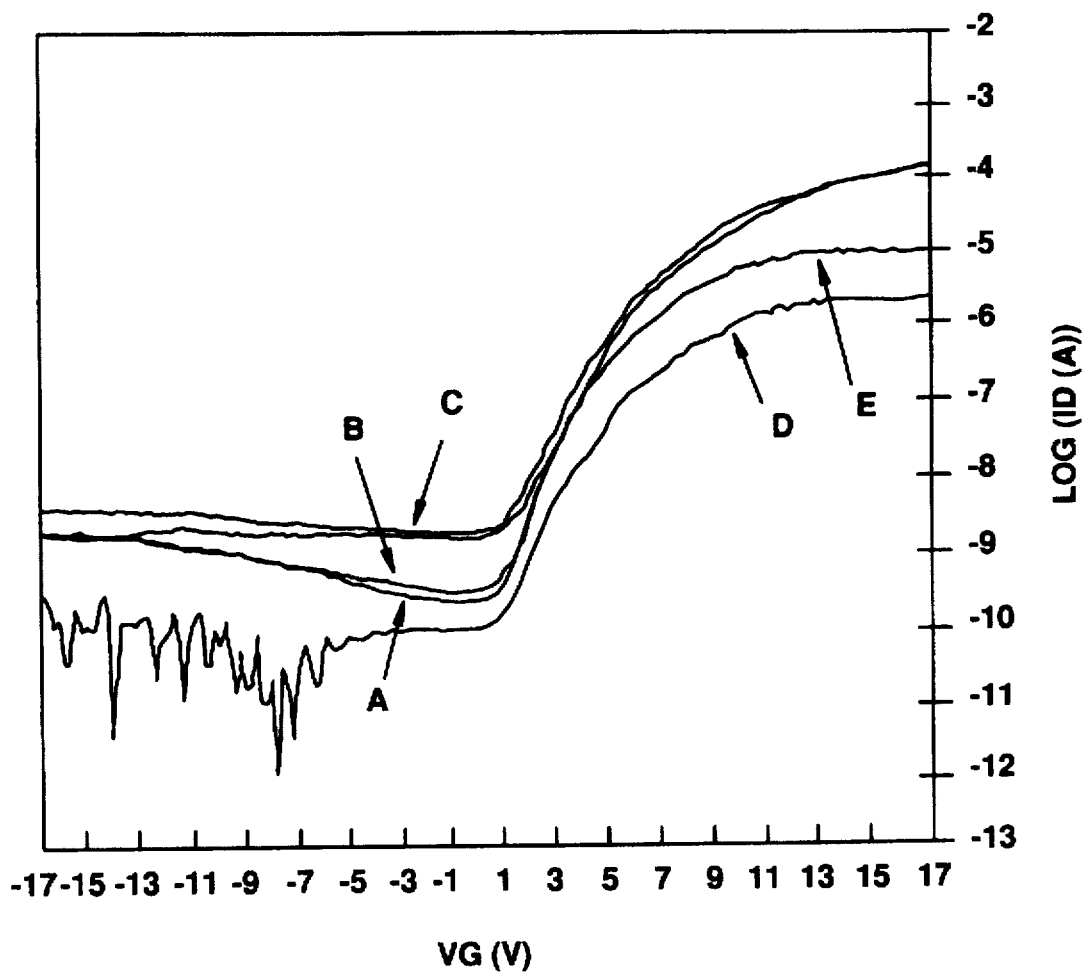
FIG. 6 is a graph showing a characteristic of the image sensor element.

FIG. 6 shows the electric characteristics (VG-ID curve) of the bottom gate type image sensor element. Curve A in FIG. 6 denotes a current curve in the case where no light of 1,000 1× is projected, curve B denotes a current curve in the case where light of 1,000 1× is projected from the back surface of the substrate (from the bottom gate side), and curve C denotes a current curve in the case where light of 1,000 1× is projected from the top surface of the substrate (:in the improvement according to the present invention). An arrow D denotes a difference in current between the curves A and B, and an arrow E denotes a difference in current between the curves A and C. It is understood that the difference in current is changed five times by the projection of light of about 1,000 1× in the device according to the present invention although it of course depends upon the intensity of light. Namely, it is understood that the projection of light is outputted as a difference in output current.

According to the present invention, it is possible to manufacture an image sensor device with a high photosensitivity in a low cost. In particular, since it is possible to use, as the substrate, an alumina substrate and a semiconductor substrate which are less expensive, the productivity is enhanced. Also, the image sensor element may be produced together with its reading driver circuit with a large surface area substantially in the same process to thereby insure a high integration.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. An image sensor device comprising:
    a substrate having an insulating surface;
    a peripheral circuit comprising a thin film transistor having a channel-forming region comprising a crystalline silicon provided on said substrate; and
    an image sensor element provided on said substrate,
    wherein an active region of said image sensor element generates an optical carrier and comprises the same crystalline silicon as said channel-forming region.

2. An image sensor device comprising:
    a channel-forming region of a thin film transistor provided in a peripheral circuit and provided on an insulating surface;
    an active region of an image sensor element provided on said insulating surface,
    wherein said channel-forming region is covered with an insulating layer at an upper surface thereof and side surfaces thereof, and
    wherein said active region is covered with an insulating layer at an upper surface thereof and side surfaces thereof.

3. The device of claim 2 wherein a light irradiation is performed from an opposite side of said active region to said insulating surface.

4. The device of claim 2 wherein said image sensor element further comprises a gate electrode comprising a poly-silicon.

5. The device of claim 1 wherein a light irradiation is performed from an opposite side of said active region to said substrate.

6. The device of claim 1 wherein said image sensor element further comprises a gate electrode comprising a poly-silicon.

* * * * *

UNITED STATES PATENT AND TRADEMARK OFFICE
CERTIFICATE OF CORRECTION

PATENT NO.  : 5,731,600
DATED       : March 24, 1998
INVENTOR(S) : Mitsufumi CODAMA et al.

It is certified that error appears in the above-identified patent and that said Letters Patent is hereby corrected as shown below:

On the title page, item [73] should read:

--[73] Assignee:   Semiconductor Energy Laboratory Co., Ltd.
                   Kanagawa-ken, Japan
                        and
                   TDK Corporation
                   Tokyo, Japan--

Signed and Sealed this

Nineteenth Day of January, 1999

Attest:

Attesting Officer

*Acting Commissioner of Patents and Trademarks*